US012635253B2

(12) United States Patent
Toyoda

(10) Patent No.: US 12,635,253 B2
(45) Date of Patent: May 19, 2026

(54) SEMICONDUCTOR DEVICE AND ITS MANUFACTURING METHOD

(71) Applicant: Fuji Electric Co., Ltd., Kanagawa (JP)

(72) Inventor: Yoshiaki Toyoda, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 363 days.

(21) Appl. No.: 18/328,488

(22) Filed: Jun. 2, 2023

(65) Prior Publication Data

US 2023/0402445 A1 Dec. 14, 2023

(30) Foreign Application Priority Data

Jun. 14, 2022 (JP) ................................. 2022-096019

(51) Int. Cl.
| | |
|---|---|
| *H10D 89/10* | (2025.01) |
| *H10D 1/00* | (2025.01) |
| *H10D 1/47* | (2025.01) |
| *H10D 1/66* | (2025.01) |
| *H10D 64/27* | (2025.01) |
| *H10D 84/80* | (2025.01) |

(52) U.S. Cl.
CPC ............. *H10D 89/10* (2025.01); *H10D 1/047* (2025.01); *H10D 1/47* (2025.01); *H10D 1/665* (2025.01); *H10D 64/513* (2025.01); *H10D 84/811* (2025.01)

(58) Field of Classification Search
CPC .......... H10D 1/047; H10D 1/47; H10D 1/665; H10D 84/811; H10D 64/513; H10D 89/10; H10D 30/0297; H10D 30/668; H10D 86/85

USPC ........................................................ 257/379
See application file for complete search history.

(56) References Cited

U.S. PATENT DOCUMENTS

| | | | | |
|---|---|---|---|---|
| 5,053,743 | A * | 10/1991 | Mille | ...................... H10D 62/60 338/285 |
| 10,396,150 | B2 * | 8/2019 | Yilmaz | ............. H01L 21/26513 |
| 2007/0018748 | A1 | 1/2007 | Smolders et al. | |
| 2008/0079531 | A1 * | 4/2008 | Ohta | ...................... G01L 1/2293 338/2 |
| 2016/0172971 | A1 * | 6/2016 | Schunk | ................. H02M 3/155 323/283 |

FOREIGN PATENT DOCUMENTS

| | | |
|---|---|---|
| JP | 3161412 B2 | 4/2001 |
| JP | 2007-288104 A | 11/2007 |
| JP | 4704329 B2 | 6/2011 |

* cited by examiner

*Primary Examiner* — Monica D Harrison
(74) *Attorney, Agent, or Firm* — CHEN YOSHIMURA LLP

(57) ABSTRACT

A semiconductor device includes: a substrate of a first conductivity type; a first diffusion layer of a second conductivity type provided in an upper part of the substrate; a conductive layer embedded in a trench provided in an upper part of the first diffusion layer via an insulating film, the conductive layer forming a capacitive element together with the first diffusion layer and the insulating film; and a second diffusion layer of the first conductivity type provided in an upper part of the first diffusion layer so as to be shallower than the trench and to constitute a resistive element, wherein at least a part of the trench and at least a part of the second diffusion layer are alternately arranged side by side in a plan view.

18 Claims, 18 Drawing Sheets

SEMICONDUCTOR DEVICE AND ITS MANUFACTURING METHOD

BACKGROUND OF THE INVENTION

Technical Field

The present invention relates to a semiconductor device and its manufacturing method.

Background Art

As a conventional RC filter, a configuration is known in which an n-type diffused resistor and a planar MOS capacitor are combined. One terminal of the n-type diffused resistor is connected to one terminal of the MOS capacitor. A ground (GND) potential is applied to the other terminal of the MOS capacitor. The other terminal of the n-type diffused resistor is used as an input, and the connection point between the n-type diffused resistor and the MOS capacitor is used as an output. The n-type diffused resistor is meandered to have a high resistance.

Patent Document 1 discloses a semiconductor integrated circuit that configures an LC filter by forming an inductor element above a capacitor formed on a semiconductor substrate. Patent Document 2 discloses a semiconductor device in which a vertical trench of the substrate has a depth in the vertical direction of the substrate through a capacitive insulating film, a first polycrystalline silicon film heavily doped with impurities, and a resistor made of a second polycrystalline silicon that is doped with impurities and has a desired resistance value having a resistance length in the horizontal direction of the substrate, the resistor being embedded through a silicon oxide film. Patent Document 3 discloses a low-pass filter comprising large and small capacitors connected in parallel, with the large capacitor connected in series with a resistor.

RELATED ART DOCUMENT

Patent Document

Patent Document 1: Japanese Patent Application Laid-Open Publication No 2007-288104
Patent Document 2: Japanese Patent No. 3161412
Patent Document 3: Japanese Patent No. 4704329

SUMMARY OF THE INVENTION

However, in the conventional semiconductor devices of filters having resistive elements, inductor elements, and/or capacitive elements, since the resistive elements, inductor elements, and capacitive elements are arranged in separate regions, the occupying area becomes large.

In view of the above problems, an object of the present invention is to provide a semiconductor device capable of reducing the area in a configuration having a resistive element and a capacitive element, and a method of manufacturing the same.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, comprising: a substrate of a first conductivity type; a first diffusion layer of a second conductivity type provided in an upper part of the substrate; a conductive layer embedded in a trench provided in an upper part of the first diffusion layer via an insulating film, the conductive layer forming a capacitive element together with the first diffusion layer and the insulating film; and a second diffusion layer of the first conductivity type provided in an upper part of the first diffusion layer so as to be shallower than the trench and to constitute a resistive element, wherein at least a part of the trench and at least a part of the second diffusion layer are alternately arranged side by side in a plan view.

In another aspect, the present disclosure provides a method for manufacturing a semiconductor device, comprising: forming in an upper part of a substrate of a first conductivity type a first diffusion layer of a second conductivity type; forming a second diffusion layer of the first conductivity type that constitutes a resistive element in an upper part of the first diffusion layer; forming a trench deeper than the second diffusion layer in an upper part of the first diffusion layer; and embedding a conductive layer film into the trench through an insulating film, thereby forming a capacitive element together with the first diffusion layer and the insulating film, wherein at least a part of the trench and at least a part of the second diffusion layer are alternately arranged side by side in a plan view.

According to the present invention, it is possible to provide a semiconductor device capable of reducing the area in a configuration having a resistive element and a capacitive element, and a method of manufacturing the same.

It is to be understood that both the foregoing general description and the following detailed description are exemplary and explanatory, and are intended to provide further explanation of the invention as claimed.

DETAILED DESCRIPTION OF EMBODIMENTS

Figure 1:
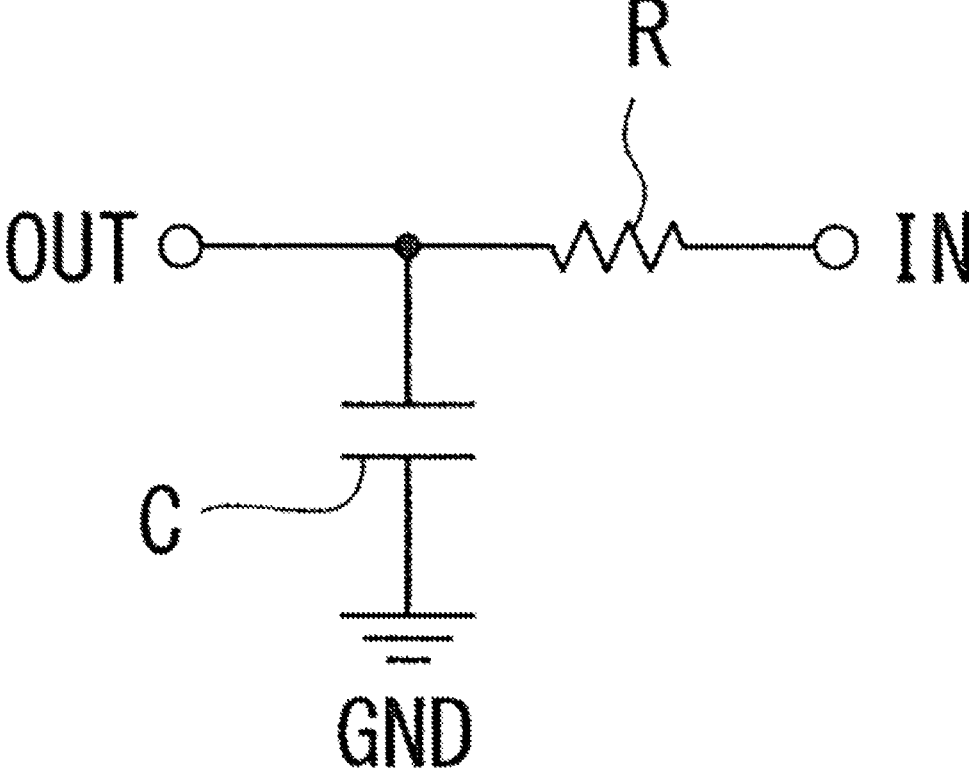
FIG. 1 is a circuit diagram of a semiconductor device according to a first embodiment.

Hereinafter, first to seventh embodiments of the present invention will be described with reference to the drawings. In the description of the drawings, the same or similar parts are denoted by the same or similar reference numerals, and overlapping descriptions are omitted. However, the drawings are schematic, and the relationship between the thickness and the planar dimensions, the ratio of the thickness of each layer, and the like may differ from the actual ones. In addition, portions having different dimensional relationships and ratios may be depicted in various drawings. Further, the first to seventh embodiments shown below are examples of apparatuses and methods for embodying the technical idea of the present invention and do not limit the shape, structure, arrangement, etc., to those specifically disclosed below.

Also, in this specification, a case where the first conductivity type is the n-type and the second conductivity type is the p-type will be exemplified. However, the conductivity types may be selected in an inverse relationship, with the first conductivity type being p-type and the second conductivity type being n-type. In addition, "+" or "−" attached to "p" or "n" indicating the conductivity type of a semiconductor region indicate higher or lower concentrations relative to a semiconductor region not marked with "+" or "−". However, even if the same "p" and "p" are attached to different semiconductor regions, it does not mean that the impurity concentrations of the respective semiconductor regions are strictly the same. Furthermore, in the following description, members and regions assigned "p-type" or "n-type" mean members and regions made of semiconductor materials, even if there is no such explicit description.

Also, in this specification, definitions of directions such as up and down are merely definitions for convenience of explanation, and do not limit the technical idea of the present invention. For example, if an object is observed after being rotated by 90°, it will be read with its top and bottom converted to left and right, and if it is observed after being rotated by 180°, it will, of course, be read with its top and bottom reversed.

First Embodiment

A semiconductor device according to a first embodiment includes an RC filter consisting of a resistor R and a capacitor C, as shown in FIG. 1. An input signal IN is input from one end of the resistor R. One end of the capacitor C is connected to the other end of the resistor R. A ground (GND) potential is applied to the other end of the capacitor C. A connection point between the other end of the resistor R and one end of the capacitor C outputs an output signal OUT. The RC filter shown in FIG. 1 may be, for example, a component of a high-side power IC.

Figure 2:
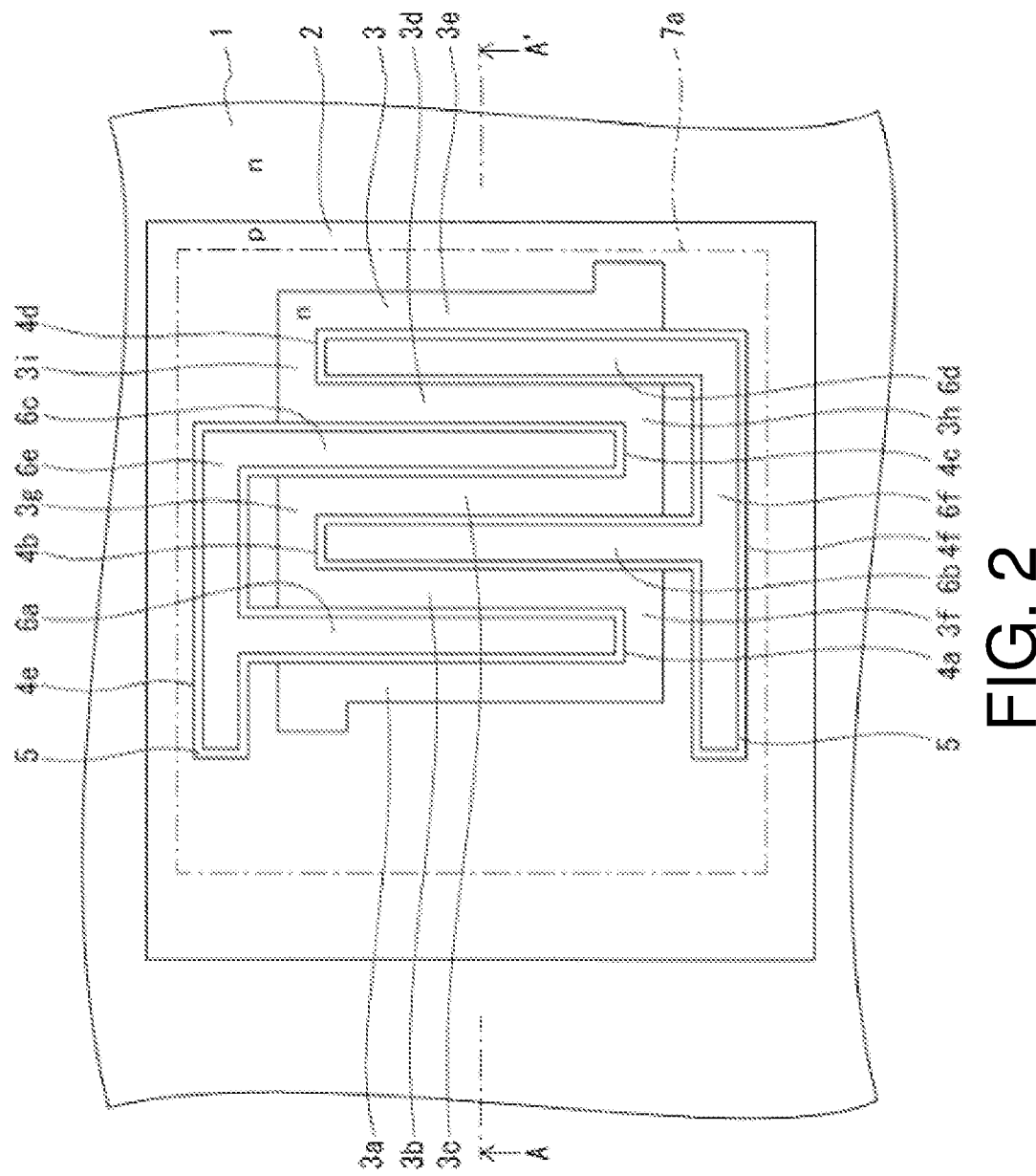
FIG. 2 is a plan view of a semiconductor device according to the first embodiment.
Figure 3:
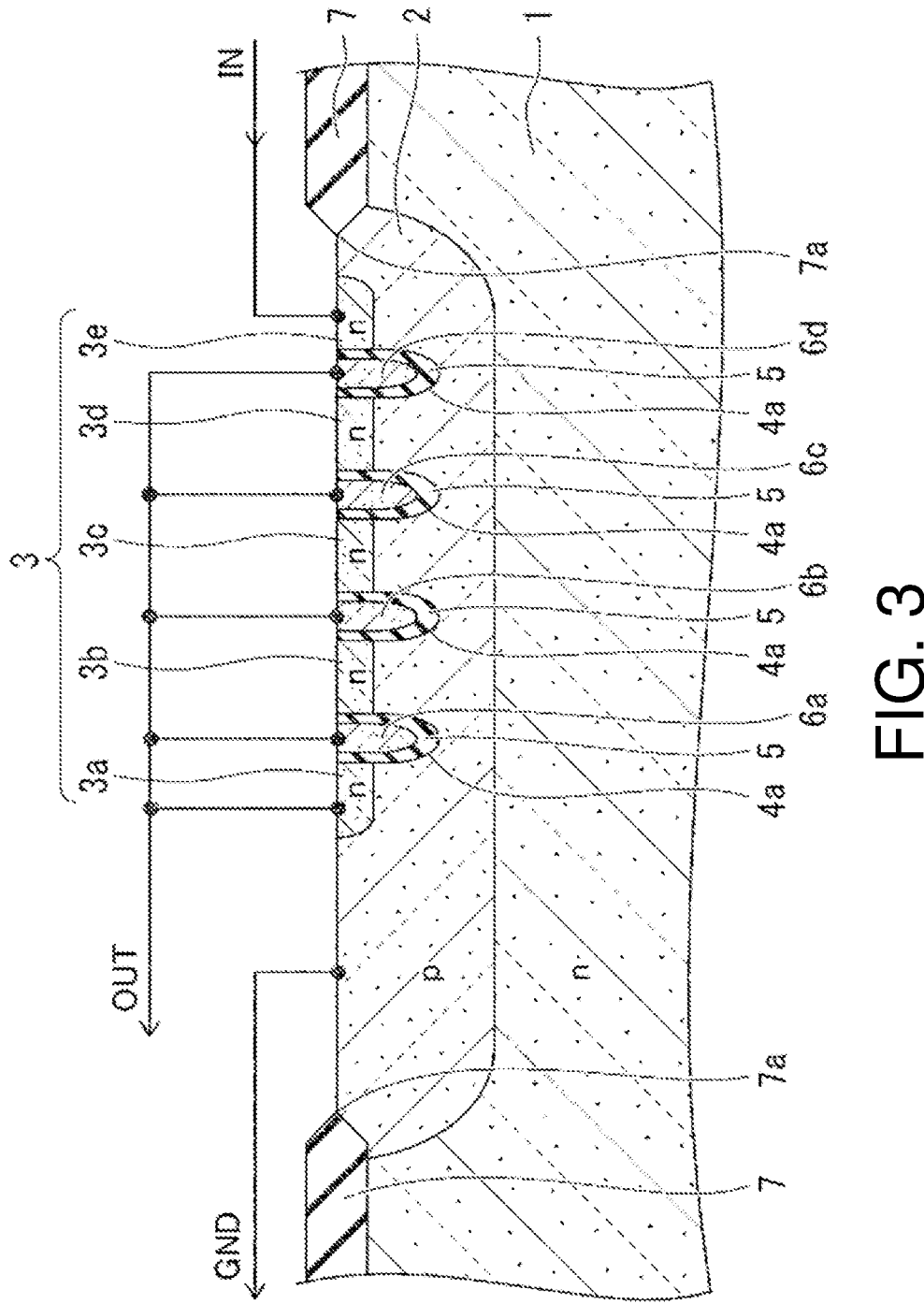
FIG. 3 is a cross-sectional view taken along line A-A' of FIG. 2.

FIG. 2 shows a planar layout of the RC filter shown in FIG. 1. FIG. 3 shows a cross-sectional view taken along line A-A' of FIG. 2. As shown in FIGS. 2 and 3, the semiconductor device according to the first embodiment includes an n-type substrate 1. The substrate 1 may be, for example, an epitaxially grown layer formed on an n+ type semiconductor substrate. The substrate 1 is made of, for example, silicon (Si), but may be made of a wide band gap semiconductor, such as silicon carbide (SiC), gallium nitride (GaN), gallium oxide ($Ga_2O_3$), diamond (C), or aluminum nitride (AlN).

As shown in FIGS. 2 and 3, a p-type diffusion layer (first diffusion layer) 2 is provided on the upper portion of the substrate 1. The first diffusion layer 2 has a substantially rectangular planar pattern. An n-type diffusion layer (second diffusion layer) 3 is provided in an upper part of the first diffusion layer 2. The second diffusion layer 3 constitutes a resistive element (diffusion resistance) and corresponds to the resistance R shown in FIG. 1.

The second diffusion layer 3 has a meandering planar pattern. The second diffusion layer 3 has a plurality of stripe portions 3a to 3e and a plurality of connecting portions 3f to 3i. The plurality of stripe portions 3a to 3e extend parallel to each other and are arranged side by side in a direction perpendicular to their extending direction.

A plurality of connecting portions 3f to 3i connect adjacent stripe portions 3a to 3e. The connecting portion 3f connects the ends of the stripe portions 3a and 3b. The connecting portion 3g connects the ends of the stripe portions 3b and 3c on the opposite side of the connecting portion 3f. The connecting portion 3h connects the ends of the stripe portions 3c and 3d on the same side of the connecting portion 3f and on the opposite side of the connecting portion 3g. The connecting portion 3i connects the stripe portions 3d and 3e on the opposite side of the connecting portions 3f and 3h and on the same side of the connecting portion 3g.

Although five stripes 3a to 3e are illustrated in FIGS. 2 and 3, the number of stripes of the second diffusion layer 3 is not particularly limited, and may be 1 to 4 or 6 or more. The number of the stripe portions and the number of the connecting portions connecting the stripe portions in the second diffusion layer 3 can be appropriately selected according to the resistance value required for the resistive element composed of the second diffusion layer 3.

The plurality of stripe portions 3a to 3e and the plurality of connecting portions 3f to 3i have, for example, the same width, but may have different widths. The plurality of stripe portions 3a to 3e have the mutually same width, but may have different widths among them. The plurality of connecting portions 3f to 3i have the mutually same width, but may have different widths among them.

As shown in FIGS. 2 and 3, trenches 4a to 4f are provided in the upper part of the first diffusion layer 2. The trenches 4a to 4f are provided shallower than the first diffusion layer 2. The bottoms of trenches 4a to 4f are located shallower than the bottom of first diffusion layer 2. The trenches 4a to 4f are provided deeper than the second diffusion layer 3. The bottoms of the trenches 4a to 4f are deeper than the bottom of the second diffusion layer 3.

The trenches 4a to 4d have striped plane patterns extending parallel to each other. The trenches 4a to 4d are arranged side by side in a direction perpendicular to their extending direction. The trenches 4a to 4d are provided alternately with the stripe portions 3a to 3e of the second diffusion layer 3, respectively.

The trench 4a is provided between the stripe portions 3a and 3b of the second diffusion layer 3. The trench 4b is provided between the stripe portions 3b and 3c of the second diffusion layer 3. The trench 4c is provided between the stripe portions 3c and 3d of the second diffusion layer 3. The trench 4d is provided between the stripe portions 3d and 3e of the second diffusion layer 3.

One side surface of the stripe portion 3a located at one end of the arrangement of the stripe portions 3a to 3e of the second diffusion layer 3 is in contact with the trench 4a, and the width of the stripe portion 3a is defined by the trench 4a. The respective side surfaces of stripe portion 3b are in contact with trenches 4a and 4b, respectively, and the width of stripe portion 3b is defined by trenches 4a and 4b. The respective side surfaces of stripe portion 3c are in contact with trenches 4b and 4c, respectively, and the width of stripe portion 3c is defined by trenches 4b and 4c. The respective side surfaces of stripe portion 3d are in contact with trenches 4c and 4d, respectively, and the width of stripe portion 3d is defined by trenches 4c and 4d. One side surface of the stripe portion 3e located at the other end of the arrangement of the stripe portions 3a to 3e of the second diffusion layer 3 is in contact with the trench 4d, and the width of the stripe portion 3e is defined by the trench 4d.

One side surface of the connecting portion 3f of the second diffusion layer 3 is in contact with the trench 4a, and the width of the connecting portion 3f is defined by the trench 4a. One side surface of the connecting portion 3g of the second diffusion layer 3 is in contact with the trench 4b, and the width of the connecting portion 3g is defined by the trench 4b. One side surface of the connecting portion 3h of the second diffusion layer 3 is in contact with the trench 4c, and the width of the connecting portion 3h is defined by the trench 4c. One side surface of the connecting portion 3i of the second diffusion layer 3 is in contact with 4d, and the width of the connecting portion 3i is defined by the trench 4d.

The trench 4e has a planar pattern extending in a direction orthogonal to the extending direction of the trenches 4a to 4d, and is connected to one longitudinal end of the trenches 4a and 4c. The trench 4f is provided on the opposite side of trench 4e across the trenches 4a to 4d. The trench 4f has a striped planar pattern extending in a direction orthogonal to the extending direction of the trenches 4a to 4d, and is connected to one longitudinal end of the trenches 4b and 4d.

As shown in FIGS. 2 and 3, the trenches 4a to 4f are filled with conductive layers 6a to 6f with an insulating film 5 interposed therebetween. The first diffusion layer 2, the insulating film 5, and the conductive layers 6a to 6f constitute trench type capacitive elements (2, 5, 6a to which correspond to the capacitor C shown in FIG. 1.

The conductive layers 6a to 6d have striped planar patterns extending parallel to each other. The conductive layer 6a is provided between the stripe portions 3a and 3b of the second diffusion layer 3 with the insulating film 5 interposed therebetween. The conductive layer 6b is provided between the stripe portions 3b and 3c of the second diffusion layer 3 with the insulating film 5 interposed therebetween. The conductive layer 6c is provided between the stripe portions 3c and 3d of the second diffusion layer 3 with the insulating film 5 interposed therebetween. The conductive layer 6d is provided between the stripe portions 3d and 3e of the second diffusion layer 3 with the insulating film 5 interposed therebetween.

The conductive layer 6e has a planar pattern extending in a direction orthogonal to the extending direction of the conductive layers 6a to 6d, and is connected to one longitudinal end of the conductive layers 6a and 6c. The conductive layer 6f is provided on the opposite side of the conductive layer 6e with the conductive layers 6a to 6d interposed therebetween. The conductive layer 6f has a planar pattern extending in a direction orthogonal to the extending direction of the conductive layers 6a to 6d, and is connected to one longitudinal end of the conductive layers 6b and 6d.

As the insulating film 5, for example, a silicon oxide film (SiO$_2$ film) or the like can be used. A film other than the silicon oxide film, such as silicon oxynitride (SiON) film, strontium oxide (SrO) film, silicon nitride (Si$_3$N$_4$) film, aluminum oxide (Al$_2$O$_3$) film, can also be used. Alternatively, magnesium oxide (MgO) film, yttrium oxide (Y$_2$O$_3$) film, hafnium oxide (HfO$_2$) film, zirconium oxide (ZrO$_2$) film, tantalum oxide (Ta$_2$O$_5$) film, and bismuth oxide (Bi$_2$O$_3$) film may be used as well. Furthermore, it is also possible to select two or more of these single-layer films and use a composite film or the like obtained by laminating a plurality of them.

As the material of the conductive layers 6a to 6f, for example, polysilicon doped with n-type impurities or p-type impurities at a high concentration (doped polysilicon) can be used. Also usable, other than the doped polysilicon (DOPOS), are refractory metals such as tungsten (W), molybdenum (Mo), and titanium (Ti), silicide of refractory metals and polysilicon, and the like. Furthermore, the material of the conductive layers 6a to 6f may be polycide, which is a composite film of polysilicon and refractory metal silicide.

As shown in FIG. 3, an insulating film 7 is provided on the top surface of the substrate 1. The insulating film 7 is composed of a field oxide film such as a local insulating film (LOCOS film). The insulating film 7 is provided with an opening 7a along the periphery of the first diffusion layer 2 for partitioning the active region. In FIG. 2, illustration of the insulating film 7 is omitted, and the opening 7a of the insulating film 7 is schematically indicated by the alternate long and short dashed line. An interlayer insulating film is actually provided on the upper surfaces of the first diffusion layer 2, the second diffusion layer 3, the insulating film 5, and on the conductive layers 6a to 6f, but is omitted from FIGS. 2 and 3.

Figure 4:
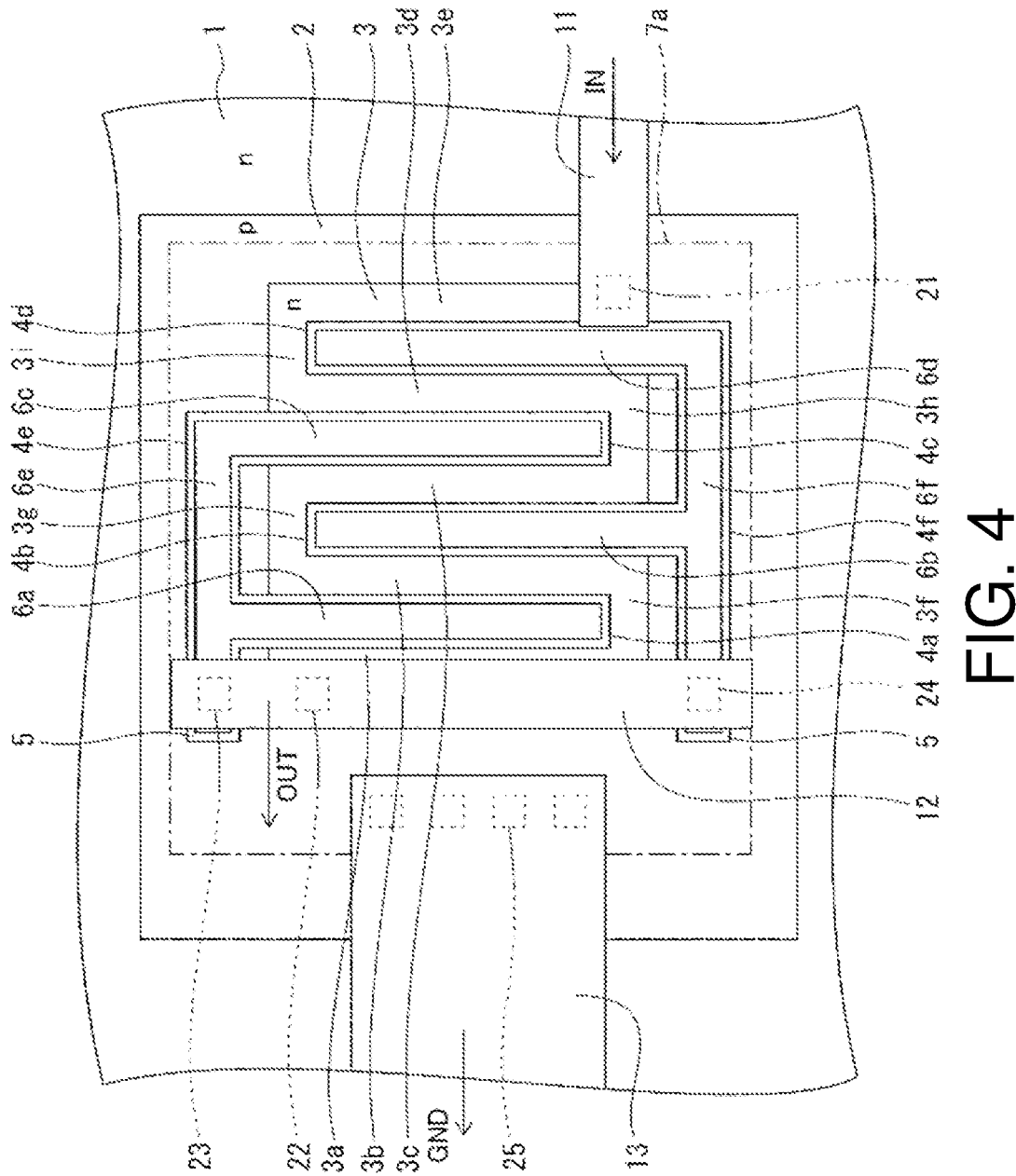
FIG. 4 is another plan view of the semiconductor device according to the first embodiment.

FIG. 4 is a planar layout obtained by adding wirings 11 to 13 to the planar layout shown in FIG. 2. An end portion of the stripe portion 3e, which is one end of the second diffusion layer 3, is connected to the wiring 11 via a via 21. An input signal IN is input to the wiring 11.

The wire 12 is connected to the other end of the stripe portion 3a of the second diffusion layer 3 via a via 22. Furthermore, a conductive layer 6e is connected to the wiring 12 via a via 23. Further, the wiring 12 is connected to the conductive layer 6f through a via 24. The wiring 12 serves as a connection point between the resistive element formed by the second diffusion layer 3 and the capacitive element (2, 5, 6a to 6f). The capacitive element (2, 5, 6a to 6f) includes a capacitive portion (2, 5, 6a, 6c, 6e) including conductive layers 6a, 6c, and 6e, and a capacitive portion (2, 5, 6b, 6d, 6f) that are connected to each other in parallel. An output signal OUT is output from the wiring 12.

The wiring 13 is connected to the first diffusion layer 2 through vias 25. A GND potential is applied to the wiring 13.

Comparative Example

Figure 5:
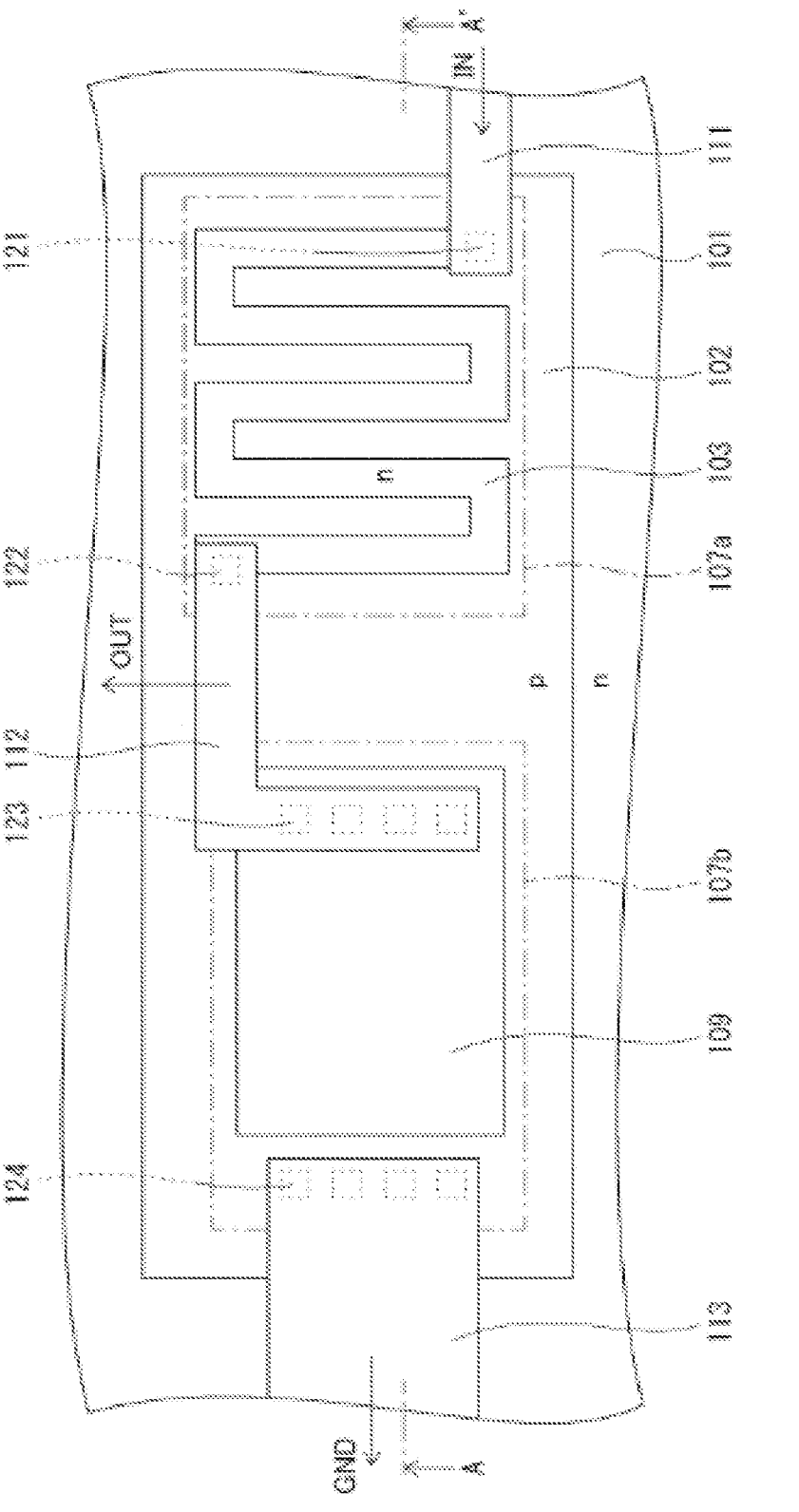
FIG. 5 is a plan view of a semiconductor device according to a comparative example.
Figure 6:
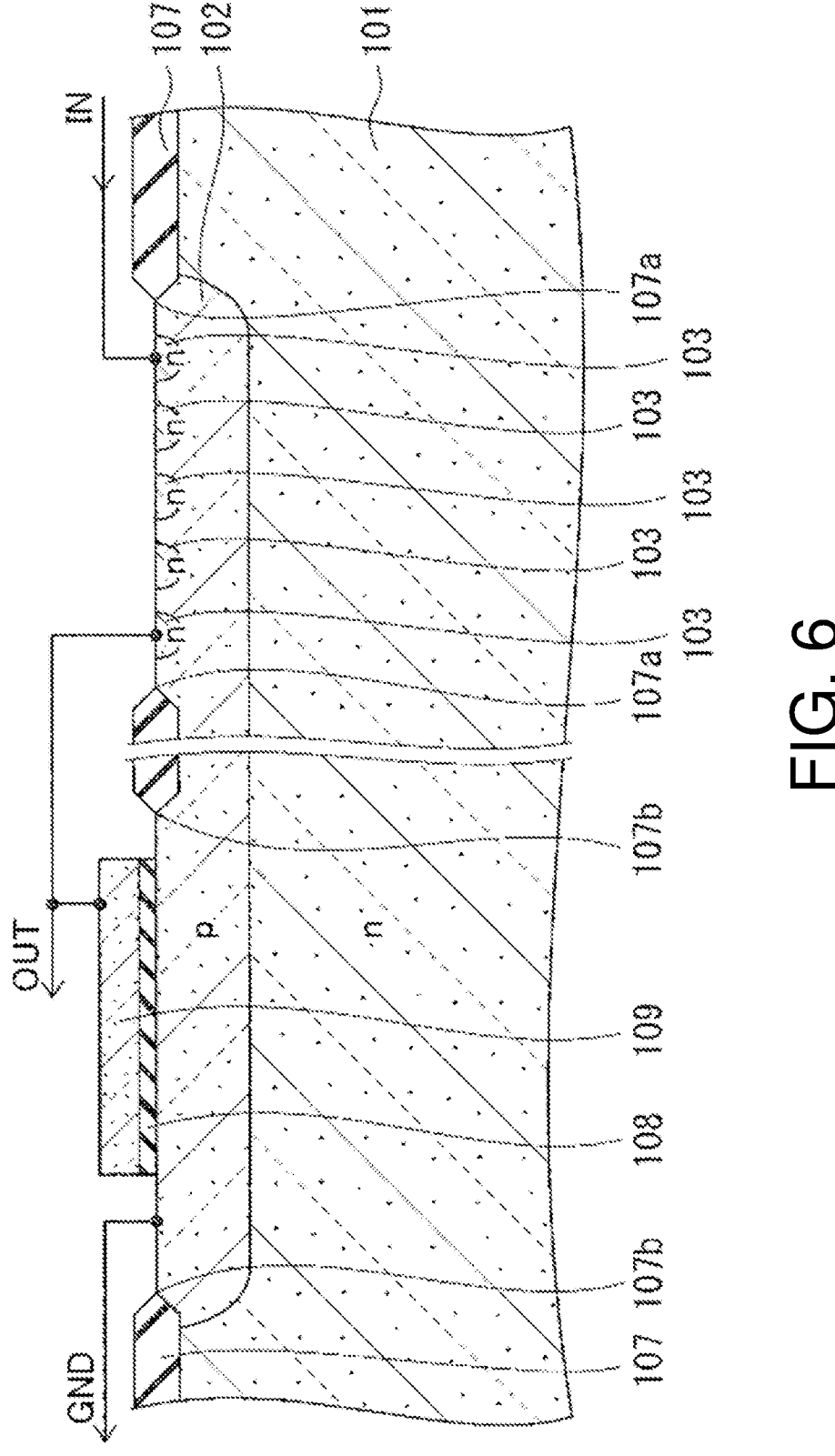
FIG. 6 is a cross-sectional view taken along line A-A' of FIG. 5.

Next, a semiconductor device according to a comparative example will be described. The circuit configuration of the semiconductor device according to the comparative example is the same as the RC filter shown in FIG. 1. As shown in FIGS. 5 and 6, a semiconductor device according to the comparative example includes a p-type diffusion layer 102 provided on an n-type substrate 101. In an upper part of the p-type diffusion layer 102, an n-type diffusion layer 103 forming a resistive element is provided. The n-type diffusion layer 103 has a meandering planar pattern.

A conductive layer 109 made of polysilicon is provided in the upper part of the p-type diffusion layer 102 with an insulating film 108 interposed therebetween. The p-type diffusion layer 102, the insulating film 108, and the conductive layer 109 constitute a MOS type capacitive element (102, 108, 109).

As shown in FIG. 6, an insulating film 107 is provided on the top surface of the p-type diffusion layer 102. The insulating film 107 is provided with an opening 107a surrounding the n-type diffusion layer 103 and an opening 107b surrounding the capacitive element (102, 108, 109). In FIG. 5, illustration of the insulating film 107 is omitted, and the openings 107a and 107b are schematically indicated by the alternate long and short dashed lines.

As shown in FIG. 5, a wiring 111 is connected to one end of the n-type diffusion layer 103 via a via 121. An input signal IN is input to the wiring 111. A wiring 112 is connected to the other end of the n-type diffusion layer 103 through a via 122. The wiring 112 is connected to the conductive layer 109 through a via 123. The wiring 112 serves as a connection point between the resistive element formed by the n-type diffusion layer 103 and the capacitive element (102, 108, 109), and outputs an output signal OUT. A wiring 113 is connected to the p-type diffusion layer 102 through a via 124. A GND potential is applied to the wiring 113.

In the semiconductor device according to the comparative example, as shown in FIGS. 5 and 6, since the resistor element constituted by the n-type diffusion layer 103 and the capacitor element (102, 108, 109) are formed in separate regions, the total area becomes larger. On the other hand, according to the semiconductor device of the first embodiment, as shown in FIGS. 2 to 4, trenches 4a to 4d, and the stripe portions 3a to 3e of the second diffusion layer 3 are arranged alternately, and the resistive element constituted by the second diffusion layer 3 and the trench type capacitive element (2, 5, 6a to 6f) are arranged close to each other. As a result, the area of the RC filter can be reduced, and an RC filter with good area efficiency can be realized.

Further, when manufacturing the semiconductor device according to the comparative example shown in FIGS. 5 and 6, in order to form the n-type diffusion layer 103, an n-type impurity is ion-implanted using a mask having a meandering pattern opening. However, since the implanted n-type impurity is laterally diffused by heat treatment after the ion implantation, it is necessary to secure the interval between the stripes of the meandering pattern of the second diffusion layer 103 in advance. In contrast, according to the semiconductor device of the first embodiment, as shown in FIGS. 2 to 4, by defining (restricting) the widths of the stripe portions 3a to 3e of the second diffusion layer 3 by the intervals of the trenches 4a to 4d, the interval between the stripe portions 3a to 3e of the second diffusion layer 3 can be narrowed, and the area of the resistive element constituted by the second diffusion layer 3 can be reduced.

<Semiconductor Device Manufacturing Method>

Next, an example of the method for manufacturing the semiconductor device of the first embodiment will be described with reference to FIGS. 7 to 12. The right side of FIGS. 7 to 12 shows the manufacturing process of the RC filter of the semiconductor device of the first embodiment, and the left side of FIGS. 7 to 12 shows a manufacturing process of a trench gate type metal oxide semiconductor field effect transistor (MOSFET).

Figure 7:
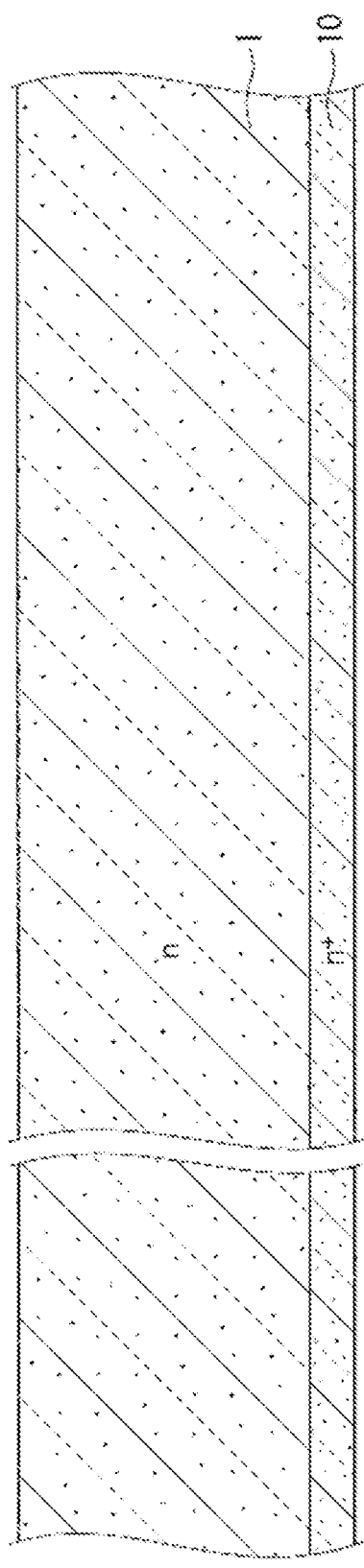
FIG. 7 is a cross-sectional view for explaining a method of manufacturing the semiconductor device according to the first embodiment.
Figure 8:
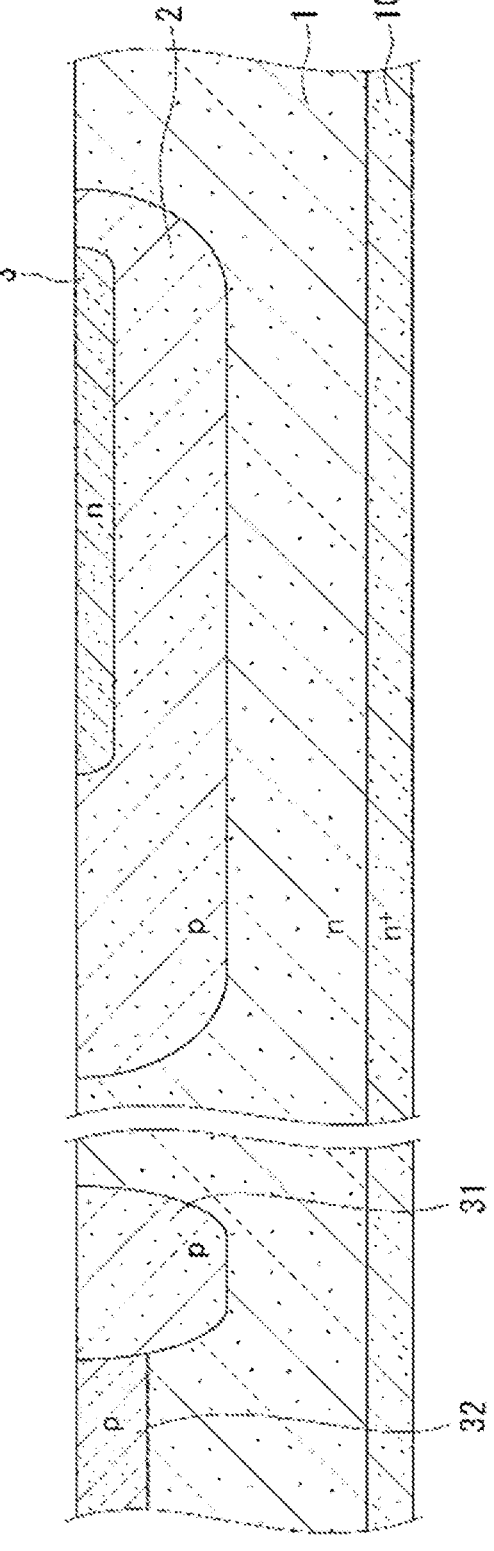
FIG. 8 is a cross-sectional view of the next step of FIG. 7 for explaining the method of manufacturing the semiconductor device according to the first embodiment.
Figure 9:
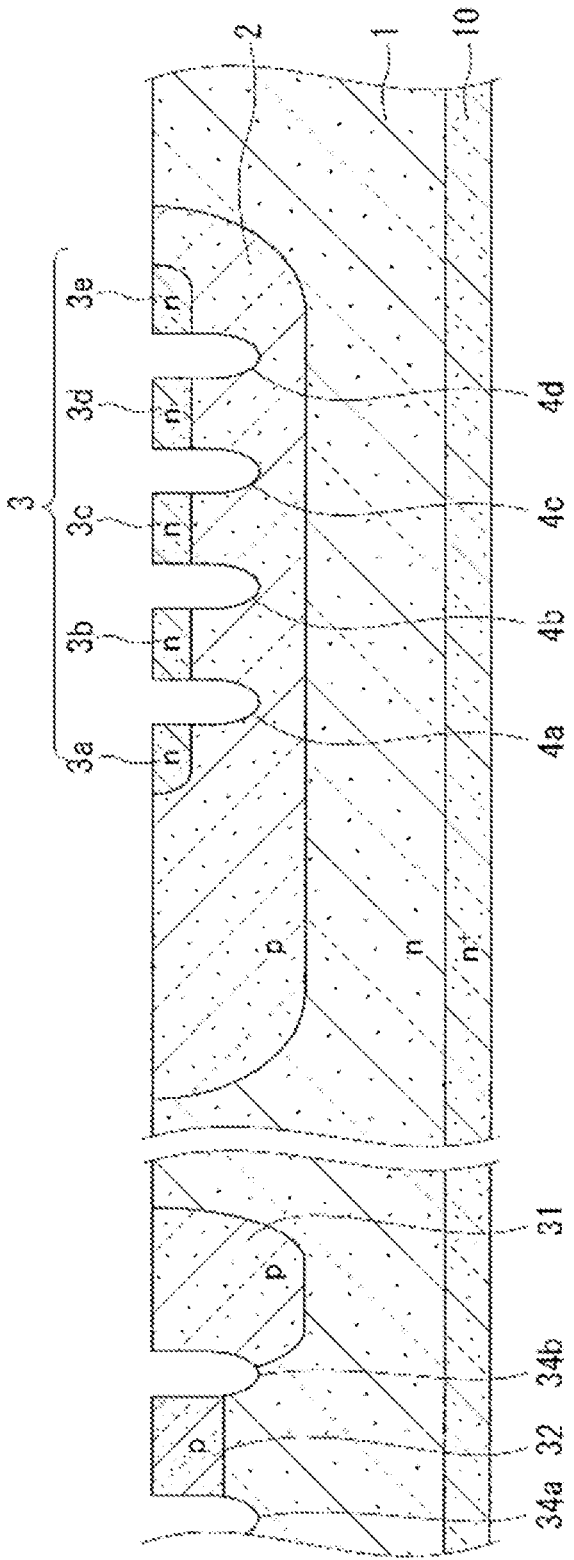
FIG. 9 is a cross-sectional view of the next step of FIG. 8 for explaining the method of manufacturing the semiconductor device according to the first embodiment.

First, as shown in FIG. 7, an n+ type semiconductor substrate 10 is prepared, and an n-type substrate 1 is epitaxially grown on the upper surface of the semiconductor substrate 10.

Next, a photolithography process and an ion implantation process are repeated to implant p-type impurity ions and n-type impurity ions into the substrate 1. Next, by a heat treatment is performed to activate the implanted p-type impurity and n-type impurity. As a result, as shown on the right side of FIG. 8, a p-type first diffusion layer 2 is formed on the substrate 1, and an n-type second diffusion layer 3 is formed on the first diffusion layer 2. Also, as shown on the left side of FIG. 8, a p-type diffusion layer 31 and a p-type base region 32 for a trench gate type MOSFET are formed.

Next, a photoresist film is applied to the upper surface of the substrate 1, and the photoresist film is patterned by photolithography. Using the patterned photoresist film as a mask, trenches 4a to 4d are formed by dry etching as shown on the right side of FIG. 9. At this time, the trenches 4e and 4f shown in FIG. 2 are also formed at the same time. As a result, a portion of the second diffusion layer 3 is selectively removed by the trenches 4a to 4d, and the widths of the stripe portions 3a to 3e and the connecting portions 3f to 3i are defined. Further, as shown on the left side of FIG. 9, trenches 34a and 34b are formed for embedding the gate electrode structure of the trench gate type MOSFET.

Figure 10:
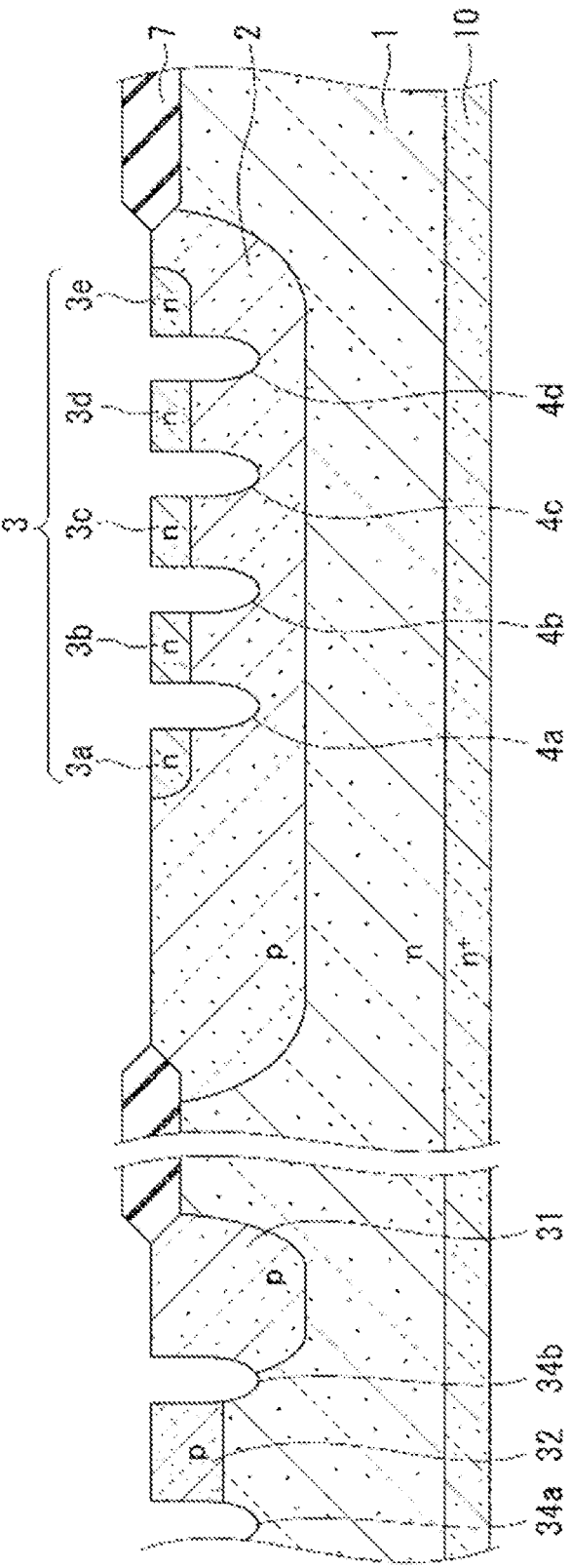
FIG. 10 is a cross-sectional view of the next step of FIG. 9 for explaining the method of manufacturing the semiconductor device according to the first embodiment.
Figure 11:
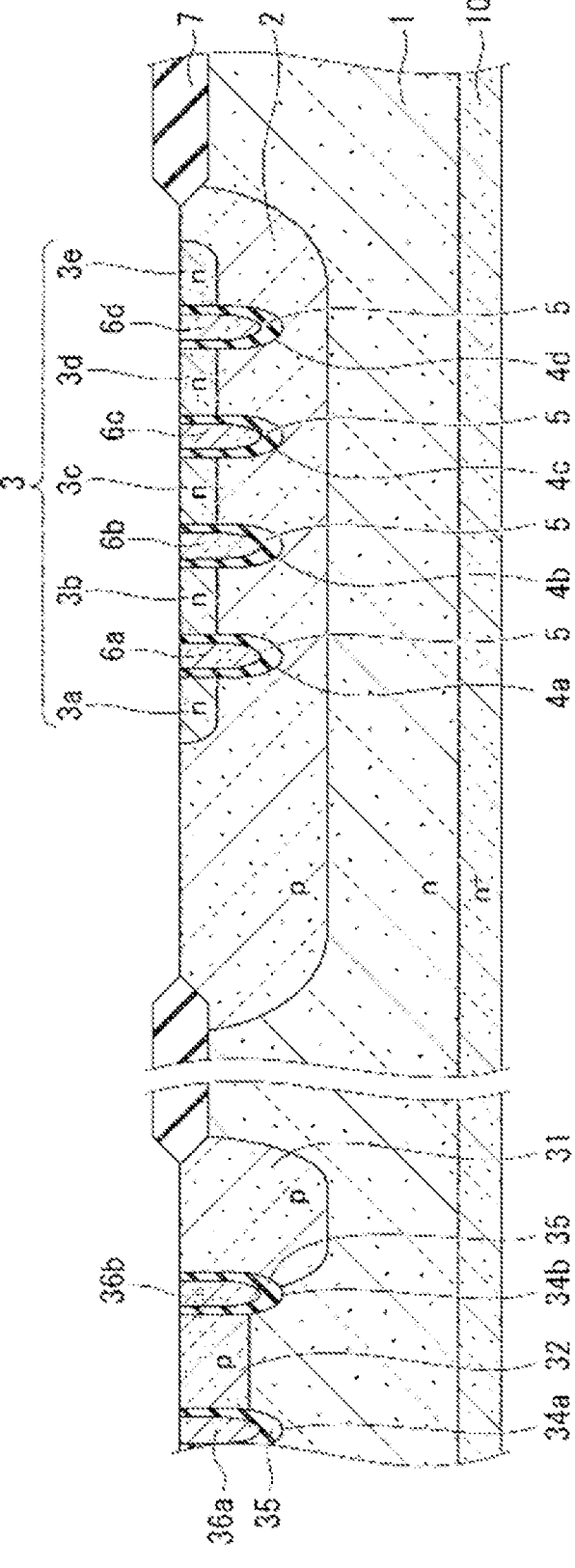
FIG. 11 is a cross-sectional view of the next step of FIG. 10 for explaining the method of manufacturing the semiconductor device according to the first embodiment.
Figure 12:
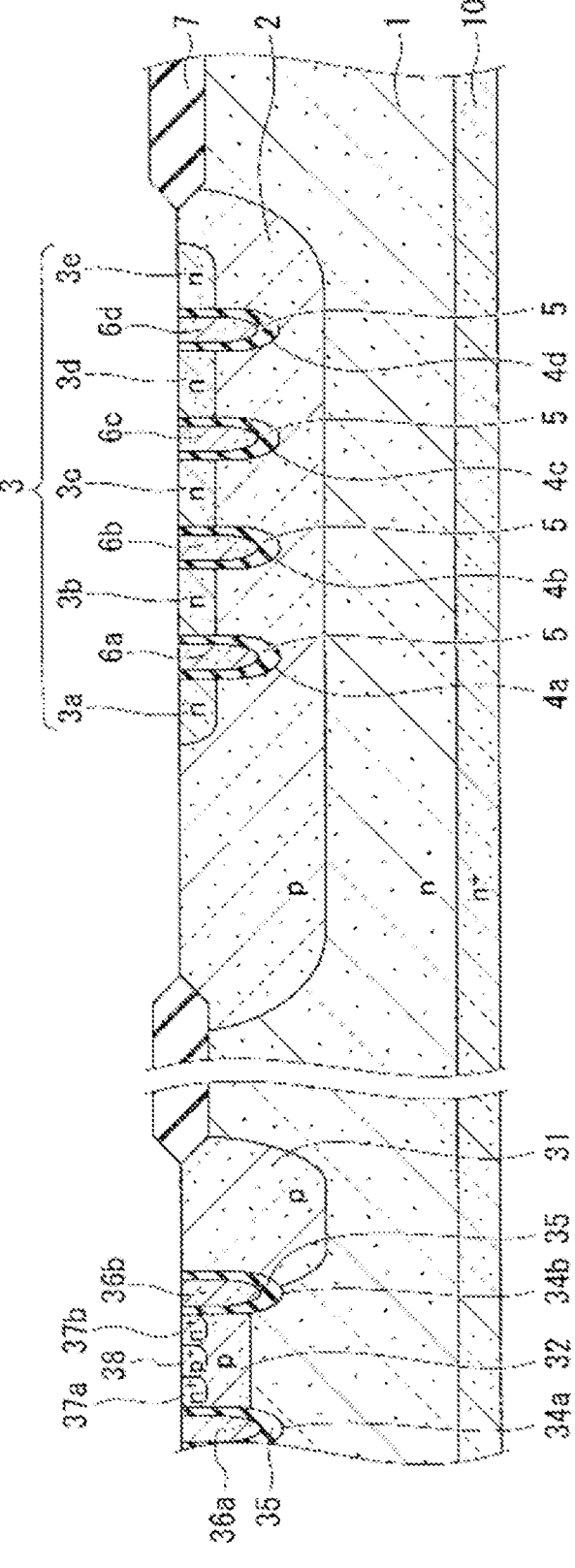
FIG. 12 is a cross-sectional view of the next step of FIG. 11 for explaining the method of manufacturing the semiconductor device according to the first embodiment.

Next, as shown in FIG. 10, an insulating film 7 made of a LOCOS film is selectively (locally) formed by a local oxidation of silicon (LOCOS) method or the like.

Next, an insulating film is formed on the entire surface including the trenches 4a to 4f and the trenches 34a and 34b by thermal oxidation or the like. Next, a polysilicon layer heavily doped with impurities is deposited on the insulating film by CVD or the like so as to fill the trenches 4a to 4f and the trenches 34a and 34b. Then, a part of the insulating film and the polysilicon layer is selectively removed by photolithography and dry etching. As a result, the trenches 4a to 4d are filled with the conductive layers 6a to 6d with the insulating film 5 interposed therebetween, as shown on the right side of FIG. 11. At this time, the conductive layers 6e and 6f are also buried in the trenches 4e and 4f shown in FIG. 2. Further, as shown on the left side of FIG. 11, gate electrodes 36a and 36b are buried in the trenches 34a and 34b via the gate insulating film 35 to form gate electrode structures (35, 36a, and 36b).

Next, the photolithography process and the ion implantation process are repeated to implant p-type impurity ions and n-type impurity ions into the substrate 1. Next, heat treatment activates the implanted p-type impurity and n-type impurity ions. As a result, n+ type source regions 37a and 37b and p+ type contact region 38 of the trench gate type MOSFET are formed in the upper part of the base region 32, as shown on the left side of FIG. 12. As a result, a trench gate type MOSFET is formed using the n+ type semiconductor substrate 10 as a drain region.

After that, wirings 11 to 13 shown in FIG. 3 and wirings such as gate wirings and source electrodes for the trench gate type MOSFETs are formed on the upper surface side of the substrate 1. Further, by forming a drain electrode and the like for a trench gate type MOSFET on the lower surface side of the base 1, the semiconductor device according to the first embodiment is completed.

According to the manufacturing method of the semiconductor device according to the first embodiment, the trenches 4a to 4f for forming the trench type capacitive elements (2, 5, 6a to 6f) are formed, and the trenches 34a and 34b for forming the trench gate type MOSFET are formed in the same process, and an increase in the number of man-hours can be suppressed.

Second Embodiment

Figure 13:
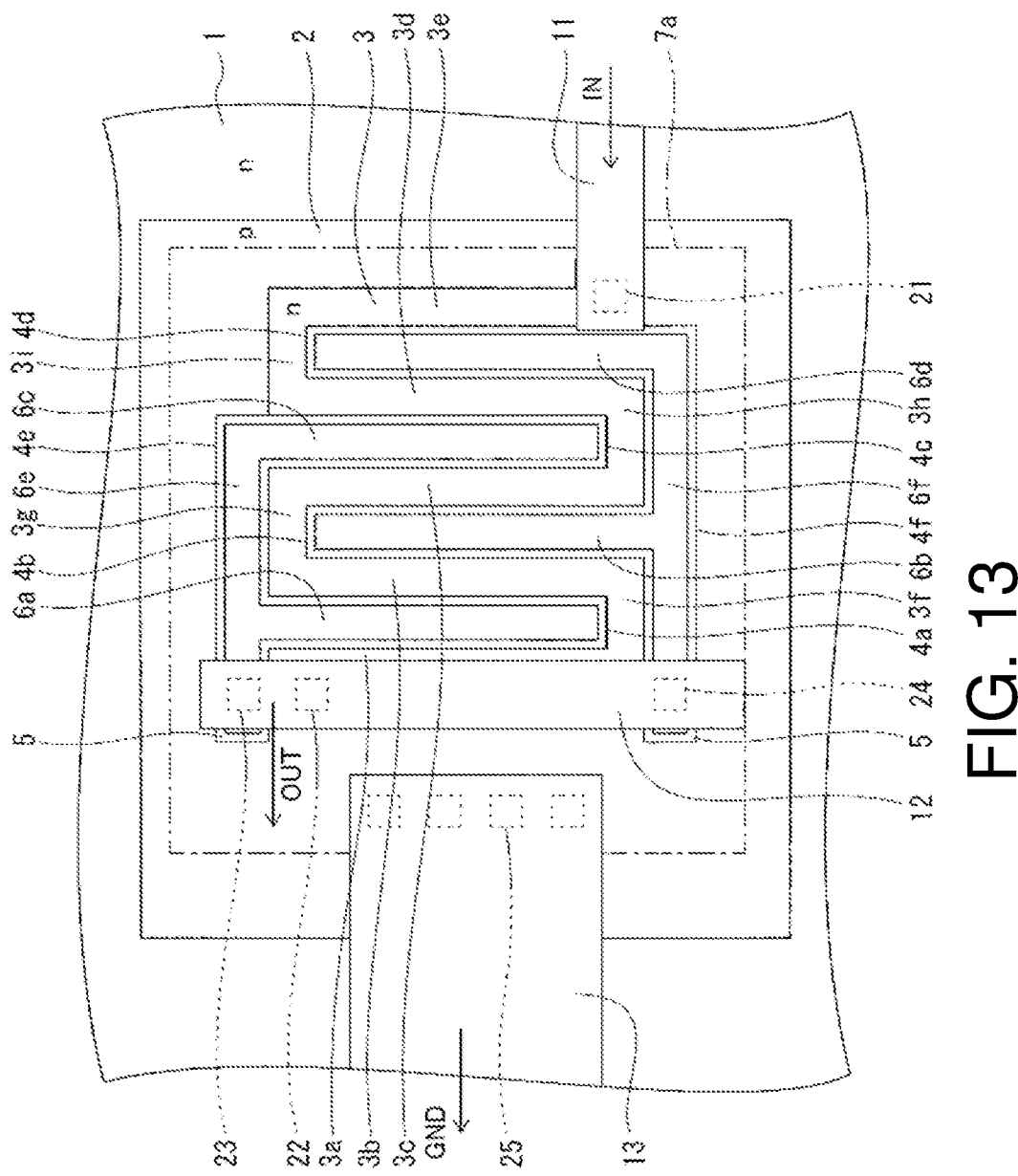
FIG. 13 is a plan view of a semiconductor device according to a second embodiment.

A semiconductor device according to a second embodiment shown in FIG. 13 differs from the semiconductor device of the first embodiment shown in FIG. 2 in that the connecting portions 3f to 3h of the second diffusion layer 3 are in contact with the trenches 4e and 4f. The connecting portions 3f and 3h of the second diffusion layer 3 are in contact with the trench 4f. The connecting portion 3g of the second diffusion layer 3 is in contact with the trench 4e. Other configurations of the semiconductor device according to the second embodiment are the same as those of the semiconductor device according to the first embodiment, and redundant description will be omitted.

According to the semiconductor device of the second embodiment, by arranging the resistive element formed by the second diffusion layer 3 and the trench-type capacitive elements (2, 5, 6a to 6f) close to each other, the area of the RC filter is reduced. Furthermore, since the connecting portions 3f to 3h of the second diffusion layer 3 are in contact with the trenches 4e and 4f, the area can be made even smaller, as compared to the case where the connecting portions 3f to 3h of the second diffusion layer 3 are separated from the trenches 4e and 4f.

Third Embodiment

Figure 14:
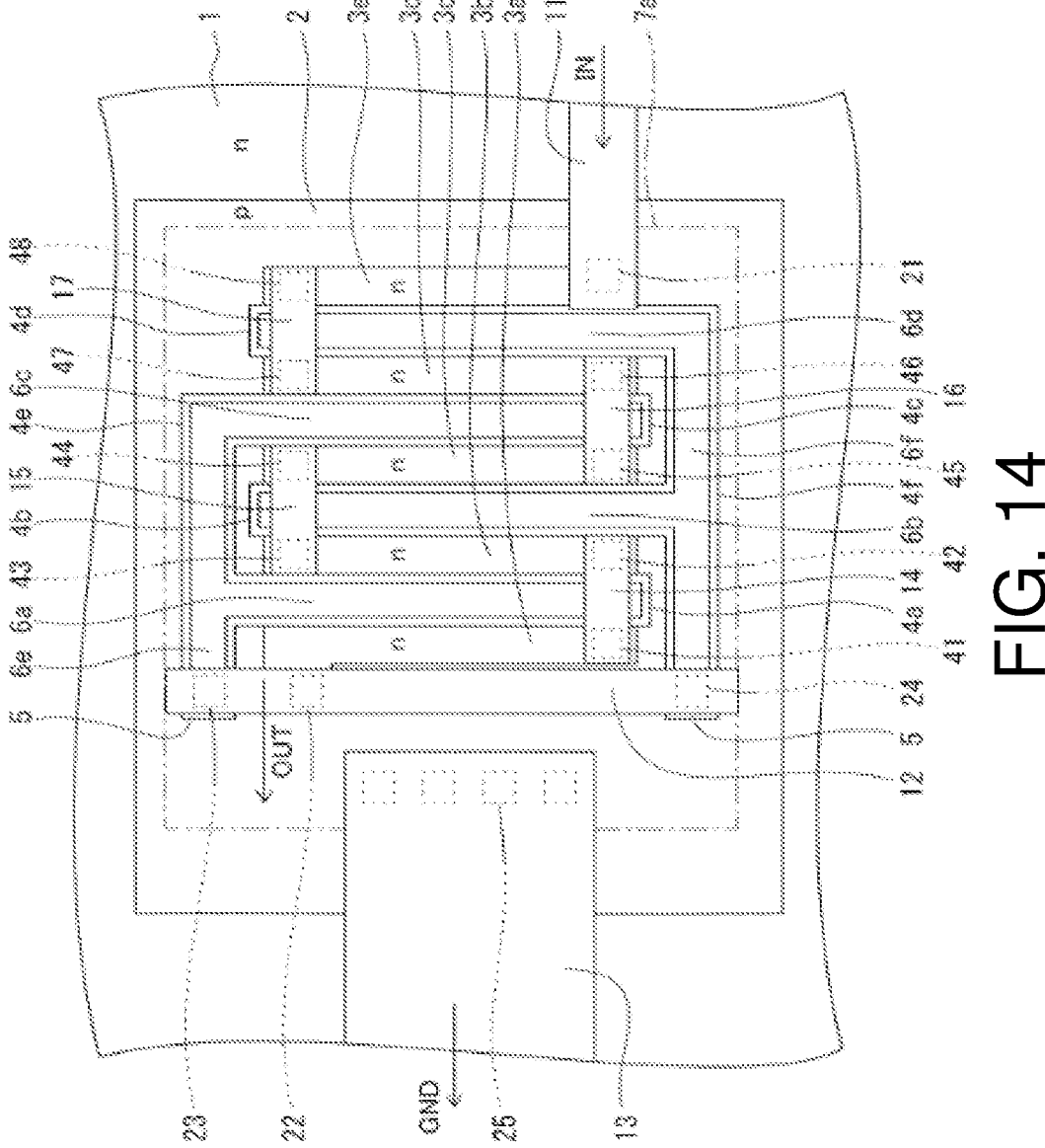
FIG. 14 is a plan view of a semiconductor device according to a third embodiment.

As shown in FIG. 14, a semiconductor device according to a third embodiment differs from the semiconductor device of the first embodiment shown in FIG. 2 in that the second diffusion layer 3 has only a plurality of stripe portions 3a to 3e, and does not have connecting portions connecting adjacent stripe portions 3a to 3e. The plurality of stripe portions 3a-3e are separated by trenches 4a-4d provided between stripe portions 3a-3e.

The semiconductor device according to the third embodiment further includes relay wirings 14-17 in addition to the wirings 11-13. The relay wiring 14 is connected through a via 41 to one end of the stripe portion 3a and through a via 42 to one end of the stripe portion 3b. The relay wiring 15 is connected through a via 43 to the other end of the stripe portion 3b and through a via 44 to one end of the stripe portion 3c.

The relay wiring 16 is connected through a via 45 to the other end of the stripe section 3c and through a via 46 to one end of the stripe section 3d. The relay wiring 17 is connected through a via 47 to the other end of the stripe portion 3d and through a via 48 to one end of the stripe portion 3e. A plurality of stripe portions 3a to 3e of the second diffusion layer 3 are connected in series by relay wirings 14 to 17 to form a resistive element. Since other configurations of the semiconductor device of the third embodiment are the same as those of the semiconductor device of the first embodiment, redundant description will be omitted.

According to the semiconductor device of the third embodiment, by arranging the resistive elements formed by the second diffusion layer 3 and the trench-type capacitive elements (2, 5, 6a to 6f) close to each other, the area of the RC filter is reduced. Further, because the plurality of stripe portions 3a to 3e are separated and connected by the relay wirings 14 to 17, any one of the plurality of stripe portions 3a to 3e can be selectively connected by changing the configuration of the relay wirings 14 to 17. Therefore, the total resistance value of the resistive element formed by the second diffusion layer 3 can be easily adjusted.

Fourth Embodiment

Figure 15:
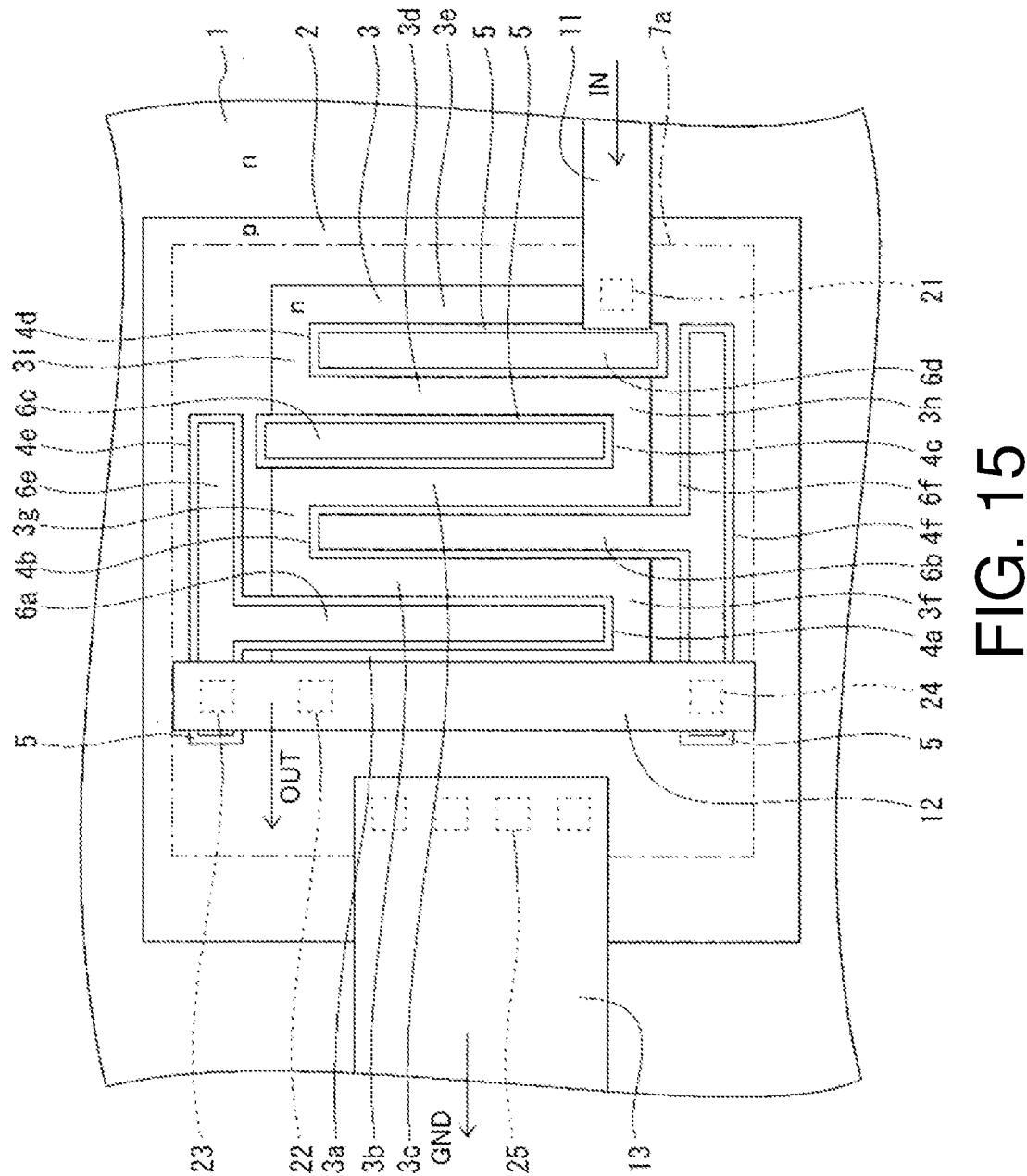
FIG. 15 is a plan view of a semiconductor device according to a fourth embodiment.

As shown in FIG. 15, a semiconductor device according to a fourth embodiment differs from the semiconductor device of the first embodiment shown in FIG. 2 in that among the trenches 4a-4f, some of the trenches, here trenches 4c and 4d, are isolated forming dummy trenches. The trench 4c is isolated from the trench 4e. The trench 4d is isolated from trench 4f. The trenches isolated from the trenches 4a to 4f are not limited to the trenches 4c and 4d and can be selected as appropriate. Other configurations of the semiconductor device according to the fourth embodiment are the same as those of the semiconductor device according to the first embodiment, and redundant description will be omitted.

According to the semiconductor device of the fourth embodiment, by arranging the resistive element formed by the second diffusion layer 3 and the trench-type capacitive elements (2, 5, 6a to 6f) close to each other, the area of the RC filter is reduced. Furthermore, when it is desired to reduce the capacitance value of the RC filter due to characteristics requirements or the like, the capacitance of the trench-type capacitive elements (2, 5, 6a, 6b, 6e, 6f) can be adjusted by isolating some of the trenches 4a to 4f.

Fifth Embodiment

Figure 16:
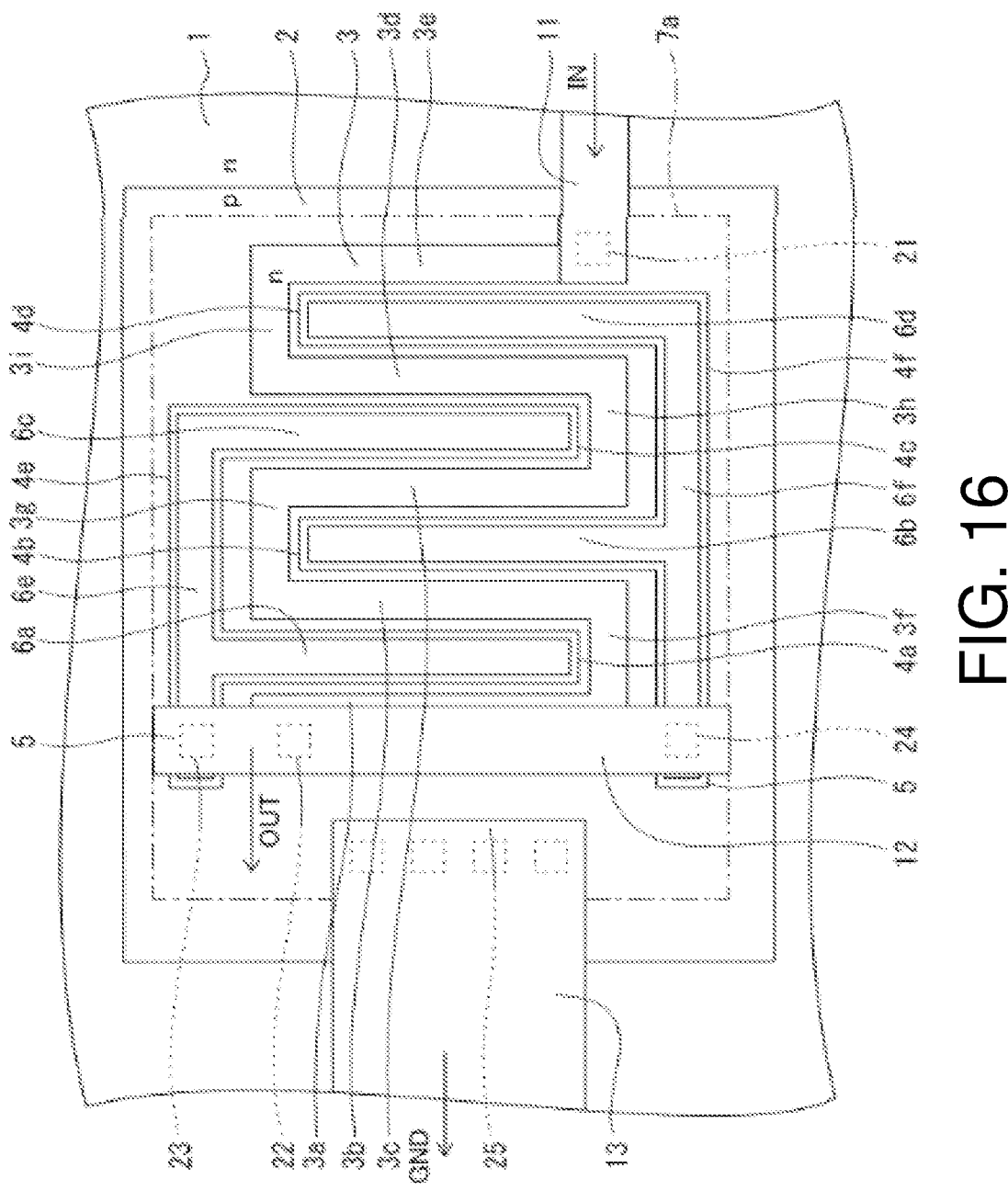
FIG. 16 is a plan view of a semiconductor device according to a fifth embodiment.

As shown in FIG. 16, a semiconductor device according to a fifth embodiment differs from the semiconductor device of the first embodiment shown in FIG. 2 in that the stripe portions 3a to 3e of the second diffusion layer 3 are separated from the trenches 4a to 4d in a plan view. The first diffusion layer 2 is provided between the stripe portions 3a to 3e of the second diffusion layer 3 and the trenches 4a to 4d, respectively.

In this case, the widths of the stripe portions 3a to 3e are not defined by the trenches 4a to 4d. Therefore, when manufacturing the semiconductor device according to the fifth embodiment, n-type impurity ions are implanted using a mask having a meandering opening in order to form the meandering shape of the second diffusion layer 3. Other configurations of the semiconductor device according to the fifth embodiment are the same as those of the semiconductor device according to the first embodiment, and redundant description will be omitted.

According to the semiconductor device of the fifth embodiment, by arranging the resistive element formed by the second diffusion layer 3 and the trench-type capacitive elements (2, 5, 6a to 6f) close to each other, the area of the RC filter is reduced. Further, by separating the stripe portions 3a to 3e of the second diffusion layer 3 from the trenches 4a to 4d, the parasitic capacitance can be reduced.

Sixth Embodiment

Figure 17:
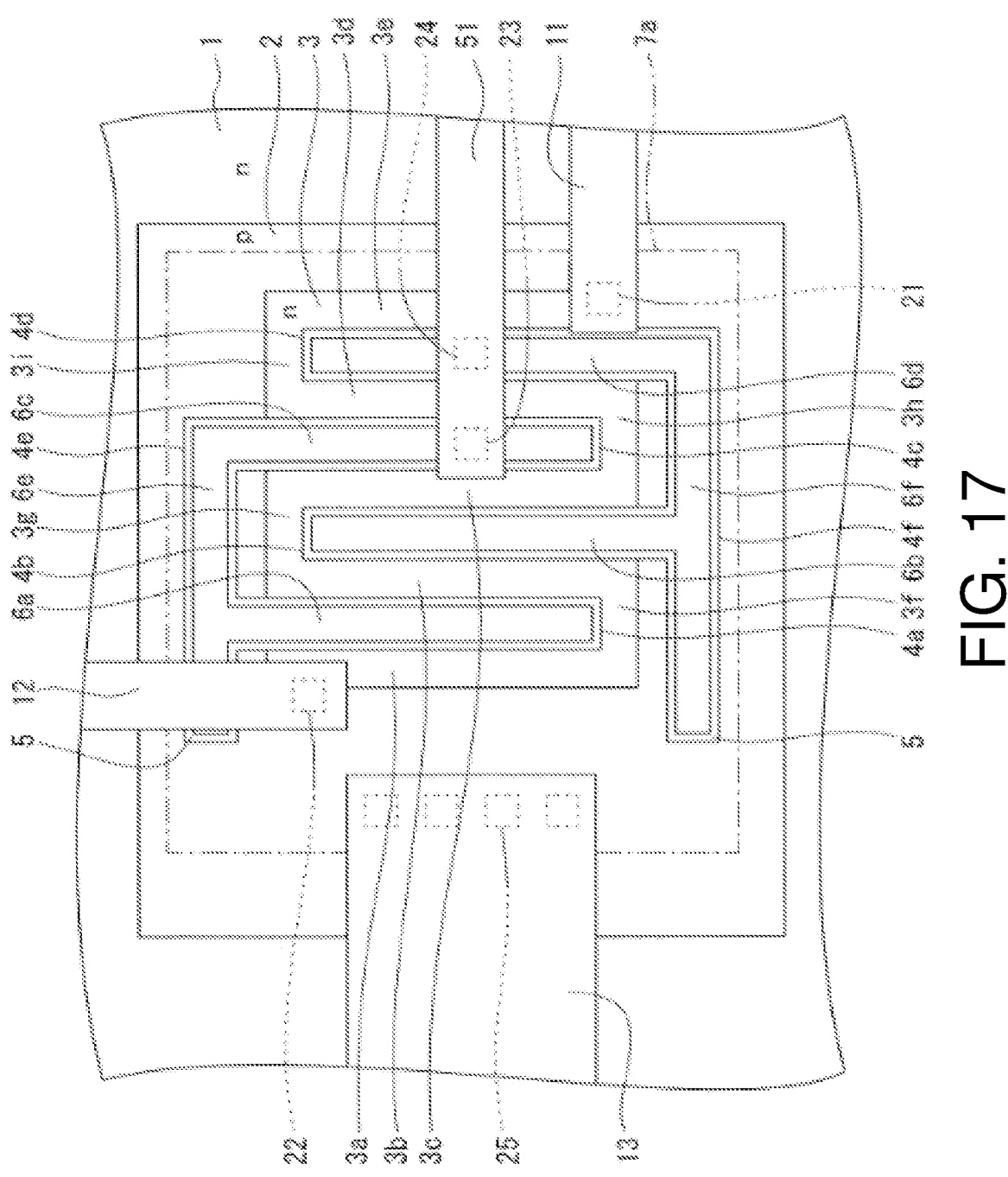
FIG. 17 is a plan view of a semiconductor device according to a sixth embodiment.

As shown in FIG. 17, a semiconductor device according to a sixth embodiment differs from the semiconductor device of the first embodiment shown in FIG. 2 in that the wirings 11 to 13 and 51 are changed in configuration, and the resistive element and the capacitive element (2, 5, 6a to 6f) are provided as individual elements.

The stripe portion 3e, which is one end of the second diffusion layer 3, is connected to a wiring 11 through a via 21. The stripe portion 3a, which is the other end of the second diffusion layer 3, is connected to a wiring 12 through a via 22. A wiring 13 is connected to the first diffusion layer 2 through vias 25. A wiring 51 is connected to the conductive layer 6c through a via 23 and connected to the conductive layer 6d through a via 24. That is, the resistive element formed by the second diffusion layer 3 and the capacitive elements (2, 5, 6a to 6f) are provided as individual elements without constituting an RC filter. Since other configurations of the semiconductor device according to the sixth embodiment are the same as those of the semiconductor device according to the first embodiment, redundant description will be omitted.

According to the semiconductor device of the sixth embodiment, even when the resistive element constituted by the second diffusion layer 3 and the capacitive elements (2, 5, 6a to 6f) are provided as separate elements, the area can be reduced by arranging the resistive element composed of the second diffusion layers 3 and the trench type capacitive elements (2, 5, 6a to 6f) close to each other.

That is, the present invention is applicable to any configuration, other than the RC filter, as long as it has a resistive element composed of the second diffusion layer 3 and a trench-type capacitive element (2, 5, 6a to 6f). For example, the resistive element formed by the second diffusion layer 3 and the capacitive element (2, 5, 6a to 6f) may not be connected and may be used as elements of completely different circuits. As a specific example, a resistive element composed of the second diffusion layer 3 may be used as a dividing circuit, and the capacitive element (2, 5, 6a to 6f) may be combined with other elements, utilizing charge/discharge of the capacitive element, to constitute a delay circuit (timer).

Seventh Embodiment

Figure 18:
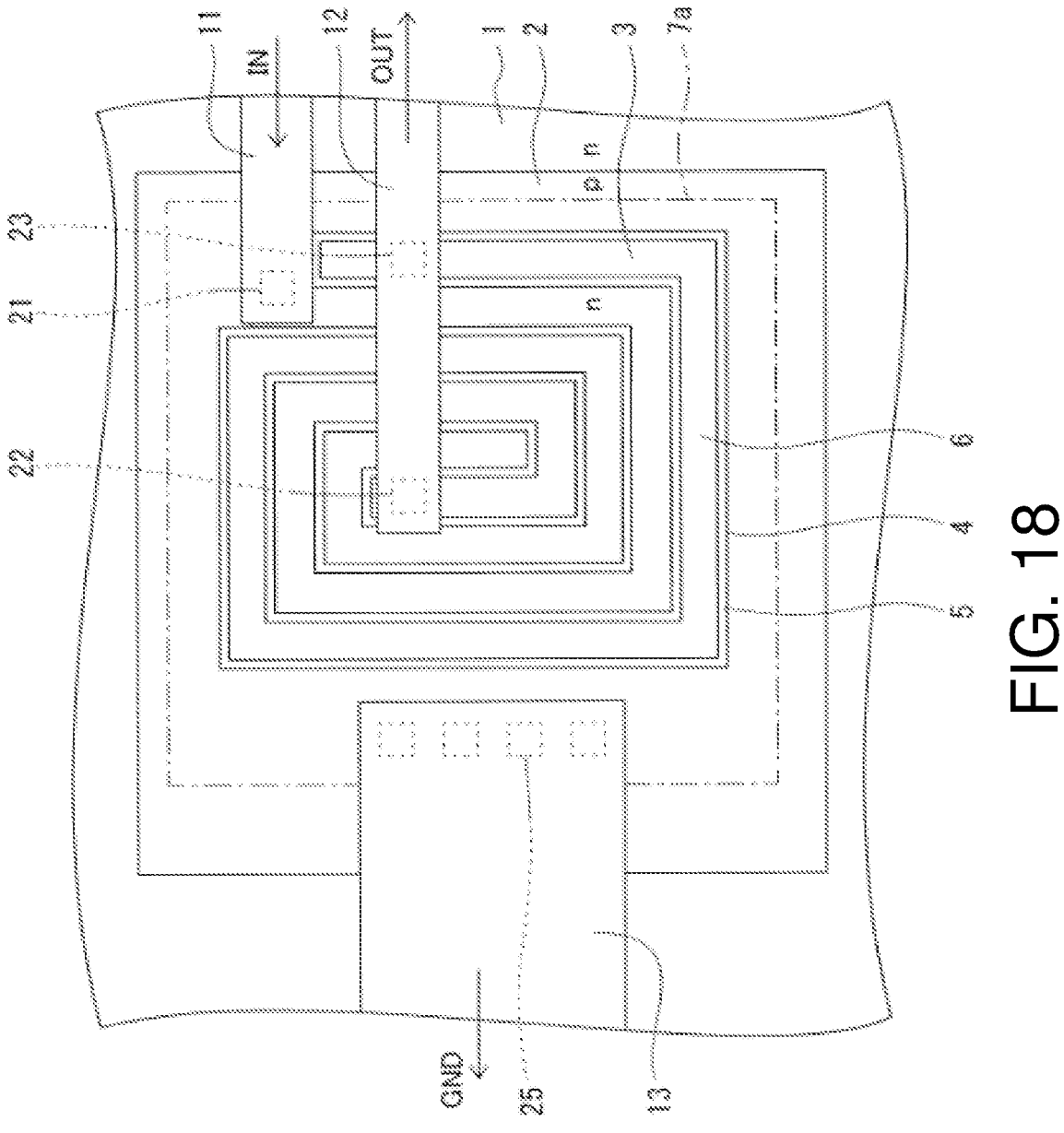
FIG. 18 is a plan view of a semiconductor device according to a seventh embodiment.

As shown in FIG. 18, a semiconductor device according to a seventh embodiment differs from the semiconductor device of the first embodiment shown in FIG. 2 in that the trenches 4 and the second diffusion layers 3 have spiral planar patterns. One end of the second diffusion layer 3 is connected to a wiring 11 through a via 21. The other end of the second diffusion layer 3 is connected to a wiring 12 through a via 22. A conductive layer 6 is provided in the trench 4 with an insulating film 5 interposed therebetween. The conductive layer 6 is connected to aa wiring 12 through a via 23. The first diffusion layer 2 is connected to the wiring 13 through a via 25. Other configurations of the semiconductor device according to the seventh embodiment are the same as those of the semiconductor device according to the first embodiment, and redundant description will be omitted.

According to the semiconductor device of the seventh embodiment, even when the trench 4 and the second diffusion layer 3 have a spiral plane pattern, the resistive element constituted by the second diffusion layer 3 and the trench-type capacitive element (2, 5, 6a to 6f) can be arranged close to each other, thereby reducing the area of the RC filter.

OTHER EMBODIMENTS

As described above, the present invention has been described with reference to the first to seventh embodiments, but it should be understood that the statements and drawings forming part of this disclosure do not limit the present invention. Various alternative embodiments, implementations and operational techniques will become apparent to those skilled in the art from this disclosure.

For example, the semiconductor devices according to the first to seventh embodiments are applicable as long as they have a configuration having a resistor element and a capacitive element. It is also applicable to power integrated circuits (power ICs) and general ICs other than power ICs.

In addition, in the manufacturing method of the semiconductor device of the first embodiment, the case where the trench gate type MOSFET is formed at the same time as the RC filter is exemplified, but an insulated gate bipolar transistor may instead be formed by changing the drain region composed of the n+ type semiconductor substrate 10 of the MOSFET to a p+ type collector region.

In addition, in the semiconductor devices according to the first to seventh embodiments, the planar pattern of the second diffusion layer 3 is meandering or spiral, but the present invention is not limited to this. That is, in order to arrange the resistive element formed by the second diffusion layer 3 and the trench-type capacitive element close to each other, at least part of the trench forming the trench-type capacitive element and at least part of the second diffusion layer may be arranged alternately. For example, depending on needs and specifications, it may be sufficient if two trenches sandwich one stripe of the second diffusion layer, or one trench may be sandwiched between two stripes of the second diffusion layer.

Also, the configurations disclosed in the first to seventh embodiments can be appropriately combined within a range that does not cause contradiction. Thus, the present invention naturally includes various embodiments and the like that are not described here. Therefore, the technical scope of the present invention is defined only by the matters specifying the invention according to the scope of claims that are valid from the above description.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:

a substrate of a first conductivity type;

a first diffusion layer of a second conductivity type provided in an upper part of the substrate;

a conductive layer embedded in a trench provided in an upper part of the first diffusion layer via an insulating film, the conductive layer forming a capacitive element together with the first diffusion layer and the insulating film; and a second diffusion layer of the first conductivity type provided in an upper part of the first diffusion layer so as to be shallower than the trench and to constitute a resistive element, wherein at least a part of the trench and at least a part of the second diffusion layer are alternately arranged side by side in a plan view.

2. The semiconductor device according to claim 1, wherein at least a part of a side surface of the second diffusion layer is in direct contact with said trench.

3. The semiconductor device according to claim 2, wherein a width of at least a part of the second diffusion layer is defined by an interval between parts of said trench that sandwich said at least the part of said second diffusion layer.

4. The semiconductor device according to claim 1, wherein at least a part of a side surface of the second diffusion layer is separated from said trench in a plan view.

5. The semiconductor device according to claim 1, wherein said second diffusion layer has a plurality of stripe portions extending parallel to each other, and wherein the plurality of stripe portions of said second diffusion layer are alternately arranged with said trench in a plan view.

6. The semiconductor device according to claim 5, wherein said second diffusion layer has a meandering planar pattern.

7. The semiconductor device according to claim 5, wherein said plurality of stripe portions are separated from each other by said trench and electrically connected to each other by a relay wiring.

8. The semiconductor device according to claim 5, wherein a part of said trench constitutes a dummy trench.

9. The semiconductor device according to claim 1, wherein said second diffusion layer has a spiral planar pattern.

10. The semiconductor device according to claim 1, wherein said resistive element and said capacitive element form an RC filter.

11. The semiconductor device according to claim 1, further comprising a trench gate semiconductor element provided on said substrate.

12. The semiconductor device according to claim 1, further comprising:
a first wiring connected to the second diffusion layer; and
a second wiring that is separate and distinct from the first wiring.

13. The semiconductor device according to claim 12, wherein the second wiring is connected to said conductive layer.

14. A method for manufacturing a semiconductor device, comprising:
forming in an upper part of a substrate of a first conductivity type a first diffusion layer of a second conductivity type;
forming a second diffusion layer of the first conductivity type that constitutes a resistive element in an upper part of the first diffusion layer;
forming a trench deeper than the second diffusion layer in an upper part of the first diffusion layer; and
embedding a conductive layer film into the trench through an insulating film, thereby forming a capacitive element together with the first diffusion layer and the insulating film,
wherein at least a part of the trench and at least a part of the second diffusion layer are alternately arranged side by side in a plan view.

15. The method according to claim 14, wherein the forming of the trench defines a width of the second diffusion layer as the resistive element by removing parts of the second diffusion layer by the trench.

16. The method according to claim 14, wherein the forming of the trench is performed simultaneously with forming a trench for embedding a gate electrode for a trench gate semiconductor element formed in the substrate.

17. The method according to claim 14, further comprising:
forming a first wiring connected to the second diffusion layer; and
forming a second wiring that is separate and distinct from the first wiring.

18. The method according to claim 17, wherein the second wiring is connected to said conductive layer.

* * * * *